(12) United States Patent
Van Antwerpen et al.

(10) Patent No.: US 9,323,385 B2
(45) Date of Patent: Apr. 26, 2016

(54) NOISE DETECTION FOR A CAPACITANCE SENSING PANEL

(75) Inventors: Hans Van Antwerpen, Mountain View, CA (US); Scott Swindle, Cardiff by the Sea, CA (US); Aaron Hogan, Ballincollig (IE); Paul Kelleher, Aherla (IE)

(73) Assignee: Parade Technologies, Ltd., Santa Clara, CA (US)

( * ) Notice: Subject to any disclaimer, the term of this patent is extended or adjusted under 35 U.S.C. 154(b) by 716 days.

(21) Appl. No.: 13/309,674

(22) Filed: Dec. 2, 2011

(65) Prior Publication Data

US 2012/0256638 A1  Oct. 11, 2012

Related U.S. Application Data

(60) Provisional application No. 61/472,172, filed on Apr. 5, 2011.

(51) Int. Cl.
*G06F 3/00* (2006.01)
*G06F 3/041* (2006.01)
*G01R 27/26* (2006.01)

(52) U.S. Cl.
CPC .......... *G06F 3/0418* (2013.01); *G01R 27/2605* (2013.01)

(58) Field of Classification Search
CPC .......................... G01R 27/2605; G06F 3/0418
USPC ........................................................ 324/613
See application file for complete search history.

(56) References Cited

U.S. PATENT DOCUMENTS

| | | | |
|---|---|---|---|
| 4,234,883 A * | 11/1980 | Kaelin et al. | 342/391 |
| 4,539,527 A * | 9/1985 | Ishigaki et al. | 330/149 |
| 6,215,477 B1 | 4/2001 | Morrison et al. | |
| 6,624,835 B2 | 9/2003 | Willig | |
| 6,734,843 B2 | 5/2004 | Bertram et al. | |
| 8,027,743 B1 | 9/2011 | Johnston | |
| 2003/0051927 A1* | 3/2003 | Inamori | 178/18.01 |
| 2006/0103635 A1 | 5/2006 | Park | |
| 2006/0146038 A1 | 7/2006 | Park et al. | |
| 2006/0279321 A1* | 12/2006 | Ruppender et al. | 324/770 |
| 2007/0071153 A1 | 3/2007 | Eglit | |
| 2008/0062148 A1 | 3/2008 | Hotelling et al. | |
| 2008/0224912 A1 | 9/2008 | Wang | |
| 2008/0285773 A1 | 11/2008 | Nongpiur et al. | |
| 2009/0228272 A1 | 9/2009 | Herbig et al. | |

(Continued)

FOREIGN PATENT DOCUMENTS

WO  2009016382 A2  2/2009

OTHER PUBLICATIONS

U.S. Appl. No. 12/907,989: "Method and Apparatus for Reducing Coupled Noise Influence in Touch Screen Controllers" Victor Kremin et al., filed Oct. 20, 2010; 44 pages.

(Continued)

*Primary Examiner* — Jeff Natalini
(74) *Attorney, Agent, or Firm* — Morgan, Lewis & Bockius LLP

(57) ABSTRACT

An embodiment of a method for detecting noise for a capacitance sensing panel may comprise generating an input signal based on a noise signal, performing a series of measurements for measuring capacitances from a capacitive sensor sensitive to the noise signal, and controlling timing for at least one of the subconversions based on the input signal.

16 Claims, 7 Drawing Sheets

(56) References Cited

U.S. PATENT DOCUMENTS

| | | | |
|---|---|---|---|
| 2010/0052700 A1* | 3/2010 | Yano et al. | 324/658 |
| 2010/0141333 A1* | 6/2010 | Lee | 327/541 |
| 2010/0172510 A1 | 7/2010 | Juvonen | |
| 2011/0115729 A1 | 5/2011 | Kremin et al. | |
| 2011/0242045 A1* | 10/2011 | Park et al. | 345/174 |
| 2012/0041704 A1* | 2/2012 | Rovner et al. | 702/100 |
| 2013/0106436 A1* | 5/2013 | Brunet et al. | 324/613 |

OTHER PUBLICATIONS

U.S. Appl. No. 13/436,535: "Method and Apparatus for Automating Noise Reduction Tuning in Real Time", Erik Anderson et al., filed Mar. 30, 2012; 56 pages.

EPO Communication Re: Rule 161 for Application No. 10825635.5 dated Jul. 3, 2012.

European Office Action for Application No. 10825635.5 dated Jun. 25, 2014; 6 pages.

International Search Report for International Application No. PCT/US10/53447 dated Dec. 14, 2010; 3 pages.

J.H. Yang, et al. "A Novel Readout IC with High Noise Immunity for Charge-Based Touch Screen Panels", dated 2010; 4 pages.

Search Report for U.S. Appl. No. 13/436,535 dated Mar. 2012; 18 pages.

Seunghoon Ko, et al. "Low Noise Capacitive Sensor for Multi-touch Mobile Handset's Applications", dated Nov. 8, 2010; 4 pages.

SIPO Office Action for Application No. 201080058070.2 dated Oct. 17, 2014; 5 pages.

Susan Pratt, "Using the Noise Reduction Feature on the AD7877", 4 pages, 2004.

USPTO Advisory Action for U.S. Appl. No. 12/907,989 dated May 1, 2014; 6 pages.

USPTO Advisory Action for U.S. Appl. No. 12/907,989 dated Oct. 30, 2013; 4 pages.

USPTO Advisory Action for U.S. Appl. No. 13/309,674 dated Dec. 23, 2014; 3 pages.

USPTO Final Rejection for U.S. Appl. No. 12/907,989 dated Feb. 13, 2014; 17 pages.

USPTO Final Rejection for U.S. Appl. No. 12/907,989 dated Aug. 15, 2013; 18 pages.

USPTO Non Final Rejection for U.S. Appl. No. 12/907,989 dated Mar. 13, 2013; 15 pages.

USPTO Non-Final Rejection for U.S. Appl. No. 12/907,989 dated Dec. 5, 2013; 15 pages.

USPTO Notice of Allowance for U.S. Appl. No. 12/907,989 dated Aug. 1, 2014; 7 pages.

USPTO Notice of Allowance for U.S. Appl. No. 12/907,989 dated Sep. 25, 2014; 5 pages.

USPTO Notice of Allowance for U.S. Appl. No. 12/907,989 dated Oct. 24, 2014; 5 pages.

Wendy Fang, "Reducing Analog Input Noise in Touch Screen Systems"; dated Jul. 2007; 12 pages.

Written Opinion of the International Searching Authority for International Application No. PCT/US10/53447 dated Dec. 14, 2010; 5 pages.

\* cited by examiner

NOISE DETECTION FOR A CAPACITANCE SENSING PANEL

RELATED APPLICATIONS

This application claims the benefit of U.S. Provisional Application No. 61/472,172, filed on Apr. 5, 2011 which is hereby incorporated by reference.

TECHNICAL FIELD

This disclosure relates to the field of touch-sensors and, in particular, to detection and suppression of noise in capacitive touch-sensor arrays.

BACKGROUND

Computing devices, such as notebook computers, personal data assistants (PDAs), kiosks, and mobile handsets, have user interface devices, which are also known as human interface devices (HID). One user interface device that has become more common is a touch-sensor pad (also commonly referred to as a touchpad). A basic notebook computer touch-sensor pad emulates the function of a personal computer (PC) mouse. A touch-sensor pad is typically embedded into a PC notebook for built-in portability. A touch sensor pad replicates X/Y movement using a collection of capacitive sensor elements, arranged along two defined axes, that detect the presence or proximity of one or more conductive objects, such as a finger. Mouse right/left button clicks can be replicated by two mechanical or capacitive-sensed buttons, located in the vicinity of the touchpad, or by tapping commands on the touch-sensor pad itself. The touch-sensor pad provides a user interface device for performing such functions as positioning a pointer, or selecting an item on a display. These touch-sensor pads may include multi-dimensional sensor arrays for determining movement of the conductive object in multiple axes. The sensor array may include a one-dimensional sensor array, detecting movement in one axis. The sensor array may also be two dimensional, detecting movements in two axes.

Another user interface device that has become more common is a touch screen. Touch screens, also known as touchscreens, touch windows, touch panels, or touchscreen panels, are transparent display overlays which are typically either pressure-sensitive (resistive or piezoelectric), electrically-sensitive (capacitive), acoustically-sensitive (surface acoustic wave (SAW)) or photo-sensitive (infra-red). Such overlays allow a display to be used as an input device, removing the keyboard and/or the mouse as the primary input device for interacting with the displayed image's content. Such displays can be attached to computers or, as terminals, to networks. Touch screens have become familiar in retail settings, on point-of-sale systems, on ATMs, on mobile handsets, on kiosks, on game consoles, and on PDAs where a stylus is sometimes used to manipulate the graphical user interface (GUI) and to enter data. A user can touch a touch screen or a touch-sensor pad to manipulate data. For example, a user can apply a single touch, by using a finger to touch the surface of a touch screen, to select an item from a menu.

BRIEF DESCRIPTION OF THE DRAWINGS

The present disclosure is illustrated by way of example, and not by way of limitation, in the figures of the accompanying drawings.

DETAILED DESCRIPTION

Figure 1:
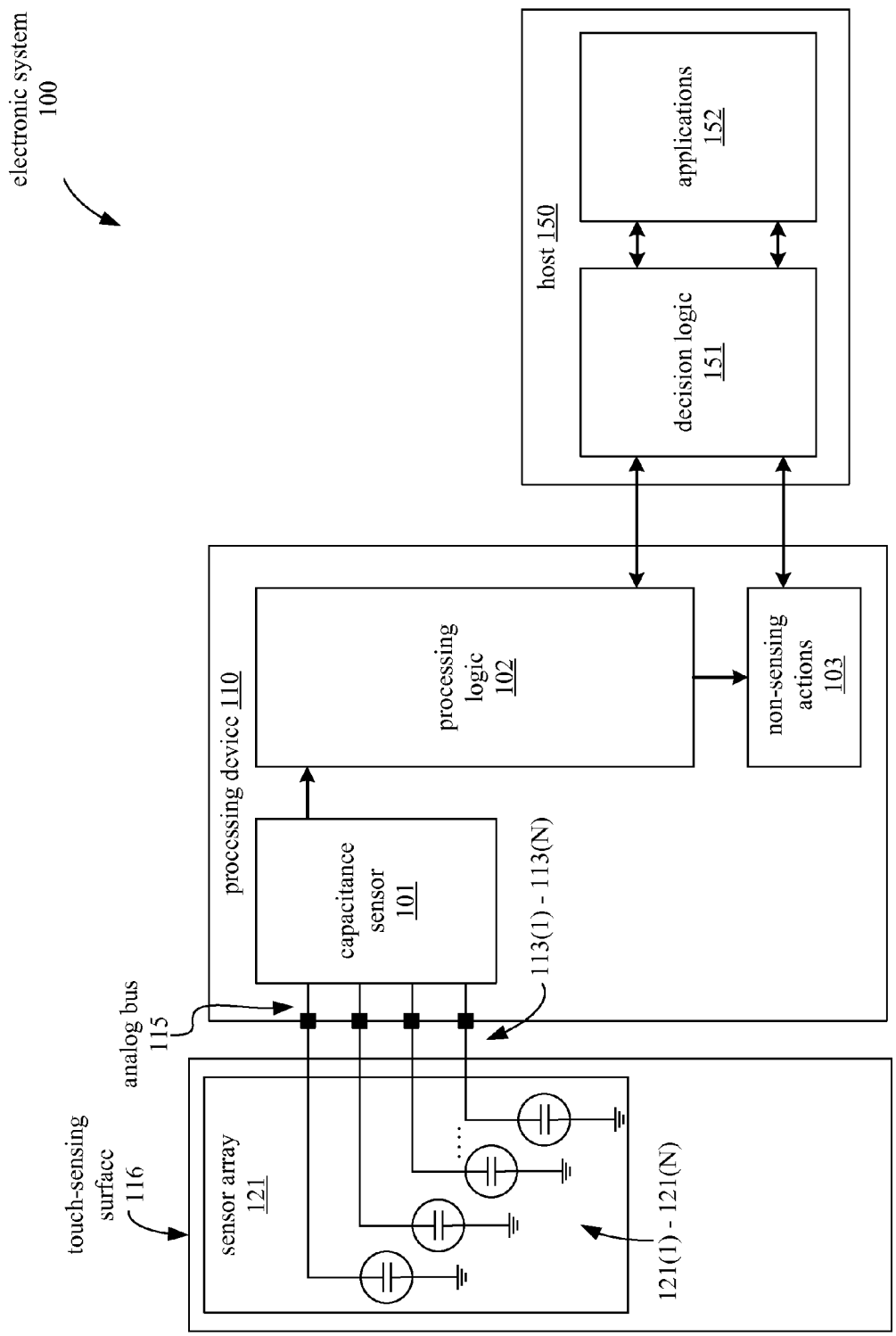
FIG. 1 is a block diagram illustrating an embodiment of an electronic system that processes touch sensor data.

The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in a simple block diagram format in order to avoid unnecessarily obscuring the present invention. Thus, the specific details set forth are merely exemplary. Particular implementations may vary from these exemplary details and still be contemplated to be within the spirit and scope of the present invention.

In one embodiment, a touch-screen system may include a capacitive sensor array overlaying a display panel, such as an LCD or LED display. The touch-screen system may include a capacitance sensor that performs a capacitance measurement of one intersection between sensor elements (conversion) of the capacitive sensor array that may be based on a number of capacitance measurements (subconversions) associated with individual TX pulses. In one embodiment, up to 255 subconversions may be performed over the course of a single conversion to determine a mutual capacitance between two intersecting sensor elements. In one embodiment, the conversions and subconversions are sequenced and controlled by a TX/RX sequencer state machine.

In one embodiment, noise from a display panel, such as an LCD panel, may include pulsed noise caused by the LCD electrode excitation signals. The intervals between subsequent noise edges may vary within the range of microseconds to milliseconds. While some display panels may generate simple periodic noise waveforms, others may generate more complex periodic waveforms with multiple edges. In one embodiment, a display panel may generate a noise pattern depending on an image being displayed. Alternatively, the noise pattern may be independent of the image being displayed.

In such a touch-screen system, the capacitive sensor array may be sufficiently sensitive to noise generated by the display panel that the noise may affect the capacitance measurements performed on the capacitive sensor array. Thus, the touch-screen system may generate a signal, such as a start signal or a reject signal, based on the noise signal. This start signal or reject signal may be used by a sequencer state machine to control the timing of capacitance measurements performed on the capacitive sensor array. In one embodiment, a reject signal may cause the sequencer to abort a subconversion in progress at a time indicated by the reject signal. In one embodiment, a start signal may cause the sequencer to initiate a subconversion, or a conversion including multiple subconversions, at a time indicated by the start signal. In one embodiment, the start signal may initiate a state transition of the sequencer state machine.

In one embodiment, a touch-screen system may limit the sequencer state machine's sensitivity to the noise signal by generating a sensitivity window signal indicating time durations during which sensitive operations are being performed. In one embodiment, the sequencer state machine may abort subconversions in progress when a reject signal is asserted within a sensitivity window. In one embodiment, the sequencer state machine may ignore assertions of the reject signal that occur outside the sensitivity window. Embodiments of a touch-screen system may thus ignore insignificant noise events, responding to the noise signal only when characteristics of the noise signal are likely to interfere with accurate measurement of the capacitive sensor elements.

In one embodiment, a touch-screen system may receive signals from any of a number of available noise signal and synchronization signal sources, and may control the timing of conversions or subconversions based on these signals. The touch-screen system may further process the signals to delay, reverse polarity, debounce, or perform other operations on the signal, then use the processed signal as a basis for controlling the timing of conversions and subconversions.

By controlling the timing of conversions and subconversions based on a detected noise signal, one embodiment of a touch-screen system may be adaptable for use with display panels or other noise sources with differing noise characteristics. Controlling the timing of conversions and subconversions based on a detected noise signal may also increase the signal to noise ratio (SNR) for the conversions.

FIG. 1 illustrates a block diagram of one embodiment of an electronic system 100 including a processing device 110 that may be configured to control the timing of conversions, subconversions, and/or TX pulses based on a noise signal, such as a noise signal generated by a display panel, as described above. The electronic system 100 includes a touch-sensing surface 116 (e.g., a touchscreen, or a touch pad) coupled to the processing device 110 and a host 150. In one embodiment, the touch-sensing surface 116 is a two-dimensional user interface that uses a sensor array 121 to detect touches on the touch sensing surface 116.

In one embodiment, the sensor array 121 includes sensor elements 121(1)-121(N) (where N is a positive integer) that are disposed as a two-dimensional matrix (also referred to as an XY matrix). The sensor array 121 is coupled to pins 113(1)-113(N) of the processing device 110 via one or more analog buses 115 transporting multiple signals. In this embodiment, each sensor element 121(1)-121(N) is represented as a capacitor.

In one embodiment, the capacitance sensor 101 may include a relaxation oscillator or other means to convert a capacitance into a measured value. The capacitance sensor 101 may also include a counter or timer to measure the oscillator output. The processing device 110 may further include software components to convert the count value (e.g., capacitance value) into a sensor element detection decision (also referred to as switch detection decision) or relative magnitude. It should be noted that there are various known methods for measuring capacitance, such as current versus voltage phase shift measurement, resistor-capacitor charge timing, capacitive bridge divider, charge transfer, successive approximation, sigma-delta modulators, charge-accumulation circuits, field effect, mutual capacitance, frequency shift, or other capacitance measurement algorithms. It should be noted however, instead of evaluating the raw counts relative to a threshold, the capacitance sensor 101 may be evaluating other measurements to determine the user interaction. For example, in the capacitance sensor 101 having a sigma-delta modulator, the capacitance sensor 101 is evaluating the ratio of pulse widths of the output, instead of the raw counts being over or under a certain threshold.

In one embodiment, the processing device 110 further includes processing logic 102. Operations of the processing logic 102 may be implemented in firmware; alternatively, it may be implemented in hardware or software. The processing logic 102 may receive signals from the capacitance sensor 101, and determine the state of the sensor array 121, such as whether an object (e.g., a finger) is detected on or in proximity to the sensor array 121 (e.g., determining the presence of the object), where the object is detected on the sensor array (e.g., determining the location of the object), tracking the motion of the object, or other information related to an object detected at the touch sensor.

In another embodiment, instead of performing the operations of the processing logic 102 in the processing device 110, the processing device 110 may send the raw data or partially-processed data to the host 150. The host 150, as illustrated in FIG. 1, may include decision logic 151 that performs some or all of the operations of the processing logic 102. Operations of the decision logic 151 may be implemented in firmware, hardware, software, or a combination thereof. The host 150 may include a high-level Application Programming Interface (API) in applications 152 that perform routines on the received data, such as compensating for sensitivity differences, other compensation algorithms, baseline update routines, start-up and/or initialization routines, interpolation operations, or scaling operations. The operations described with respect to the processing logic 102 may be implemented in the decision logic 151, the applications 152, or in other hardware, software, and/or firmware external to the processing device 110. In some other embodiments, the processing device 110 is the host 150.

In another embodiment, the processing device 110 may also include a non-sensing actions block 103. This block 103 may be used to process and/or receive/transmit data to and from the host 150. For example, additional components may be implemented to operate with the processing device 110 along with the sensor array 121 (e.g., keyboard, keypad, mouse, trackball, LEDs, displays, or other peripheral devices).

The processing device 110 may reside on a common carrier substrate such as, for example, an integrated circuit (IC) die substrate, or a multi-chip module substrate. Alternatively, the components of the processing device 110 may be one or more separate integrated circuits and/or discrete components. In one embodiment, the processing device 110 may be the Programmable System on a Chip (PSoC™) processing device, developed by Cypress Semiconductor Corporation, San Jose, Calif. Alternatively, the processing device 110 may be one or more other processing devices known by those of ordinary skill in the art, such as a microprocessor or central processing unit, a controller, special-purpose processor, digital signal processor (DSP), an application specific integrated circuit (ASIC), a field programmable gate array (FPGA), or other programmable device. In an alternative embodiment, for example, the processing device 110 may be a network processor having multiple processors including a core unit and multiple micro-engines. Additionally, the processing device 110 may include any combination of general-purpose processing device(s) and special-purpose processing device(s).

In one embodiment, the electronic system 100 is implemented in a device that includes the touch-sensing surface 116 as the user interface, such as handheld electronics, portable telephones, cellular telephones, notebook computers, personal computers, personal data assistants (PDAs), kiosks, keyboards, televisions, remote controls, monitors, handheld multi-media devices, handheld video players, gaming devices, control panels of a household or industrial appliances, or other computer peripheral or input devices. Alternatively, the electronic system 100 may be used in other types of devices. It should be noted that the components of electronic system 100 may include all the components described above. Alternatively, electronic system 100 may include only some of the components described above, or include additional components not listed herein.

Figure 2:
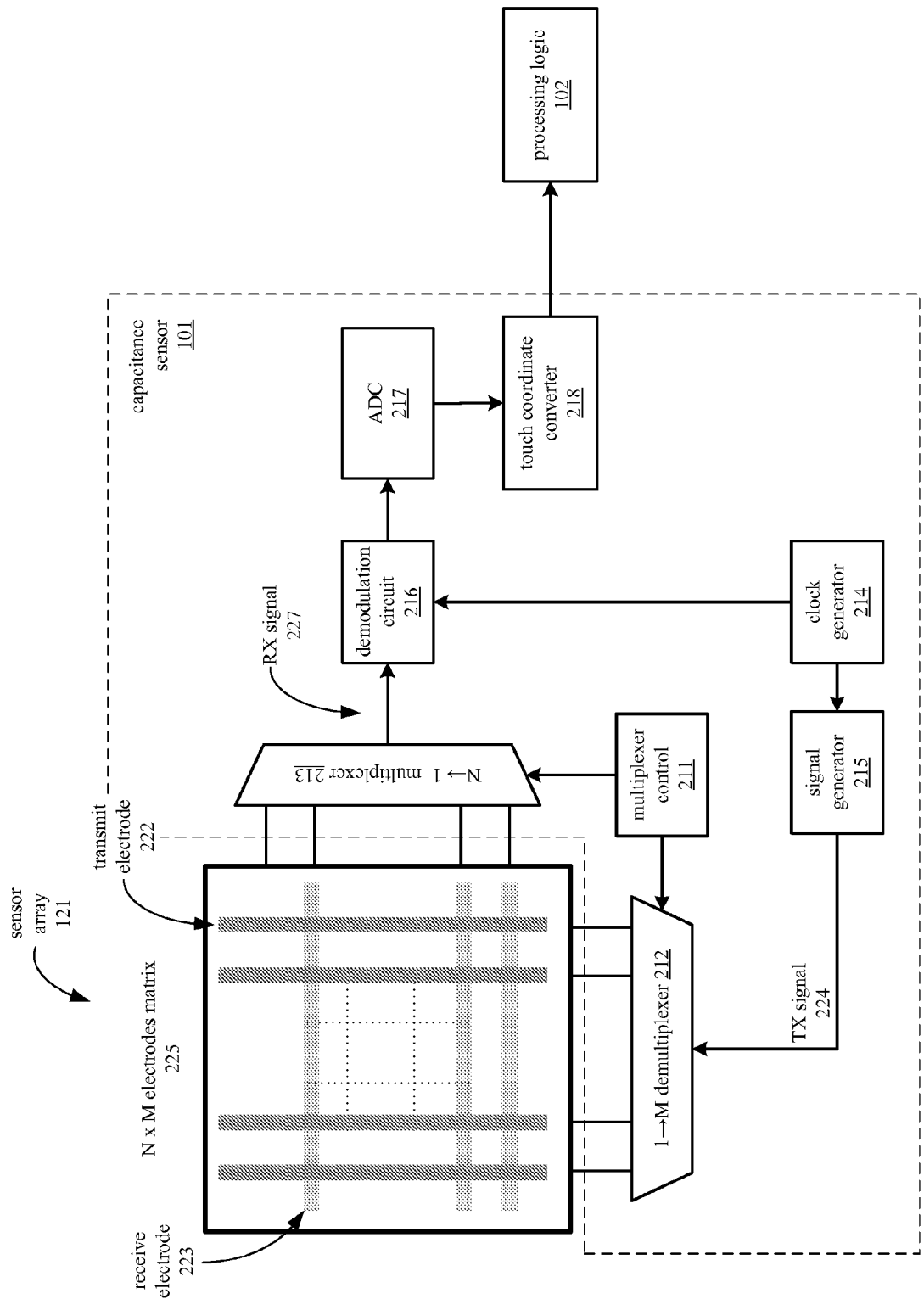
FIG. 2 is a block diagram illustrating an embodiment of an electronic system that processes touch sensor data.

FIG. 2 is a block diagram illustrating one embodiment of a capacitive touch sensor array 121 and a capacitance sensor 101 that converts changes in measured capacitances to coordinates indicating the presence and location of touch. The coordinates are calculated based on changes in measured capacitances relative to the capacitances of the same touch sensor array 121 in an un-touched state. In one embodiment, sensor array 121 and capacitance sensor 101 are implemented in a system such as electronic system 100. Sensor array 121 includes a matrix 225 of N×M electrodes (N receive electrodes and M transmit electrodes), which further includes transmit (TX) electrode 222 and receive (RX) electrode 223. Each of the electrodes in matrix 225 is connected with capacitance sensing circuit 201 through demultiplexer 212 and multiplexer 213.

Capacitance sensor 101 includes multiplexer control 211, demultiplexer 212 and multiplexer 213, clock generator 214, signal generator 215, demodulation circuit 216, and analog to digital converter (ADC) 217. ADC 217 is further coupled with touch coordinate converter 218. Touch coordinate converter 218 may be implemented in the processing logic 102.

The transmit and receive electrodes in the electrode matrix 225 may be arranged so that each of the transmit electrodes overlap and cross each of the receive electrodes such as to form an array of intersections, while maintaining galvanic isolation from each other. Thus, each transmit electrode may be capacitively coupled with each of the receive electrodes. For example, transmit electrode 222 is capacitively coupled with receive electrode 223 at the point where transmit electrode 222 and receive electrode 223 overlap.

Clock generator 214 supplies a clock signal to signal generator 215, which produces a TX signal 224 to be supplied to the transmit electrodes of touch sensor 121. In one embodiment, the signal generator 215 includes a set of switches that operate according to the clock signal from clock generator 214. The switches may generate a TX signal 224 by periodically connecting the output of signal generator 215 to a first voltage and then to a second voltage, wherein said first and second voltages are different.

The output of signal generator 215 is connected with demultiplexer 212, which allows the TX signal 224 to be applied to any of the M transmit electrodes of touch sensor 121. In one embodiment, multiplexer control 211 controls demultiplexer 212 so that the TX signal 224 is applied to each transmit electrode 222 in a controlled sequence. Demultiplexer 212 may also be used to ground, float, or connect an alternate signal to the other transmit electrodes to which the TX signal 224 is not currently being applied. In an alternate embodiment the TX signal 224 may be presented in a true form to a subset of the transmit electrodes 222 and in complement form to a second subset of the transmit electrodes 222, wherein there is no overlap in members of the first and second subset of transmit electrodes 222.

Because of the capacitive coupling between the transmit and receive electrodes, the TX signal 224 applied to each transmit electrode induces a current within each of the receive electrodes. For instance, when the TX signal 224 is applied to transmit electrode 222 through demultiplexer 212, the TX signal 224 induces an RX signal 227 on the receive electrodes in matrix 225. The RX signal 227 on each of the receive electrodes can then be measured in sequence by using multiplexer 213 to connect each of the N receive electrodes to demodulation circuit 216 in sequence.

The mutual capacitance associated with each intersection between a TX electrode and an RX electrode can be sensed by selecting every available combination of TX electrode and an RX electrode using demultiplexer 212 and multiplexer 213. To improve performance, multiplexer 213 may also be segmented to allow more than one of the receive electrodes in matrix 225 to be routed to additional demodulation circuits 216. In an optimized configuration, wherein there is a 1-to-1 correspondence of instances of demodulation circuit 216 with receive electrodes, multiplexer 213 may not be present in the system.

When a conductive object, such as a finger, approaches the electrode matrix 225, the object causes a decrease in the measured mutual capacitance between only some of the electrodes. For example, if a finger is placed near the intersection of transmit electrode 222 and receive electrode 223, the presence of the finger will decrease the charge coupled between electrodes 222 and 223. Thus, the location of the finger on the touchpad can be determined by identifying the one or more receive electrodes having a decrease in measured mutual capacitance in addition to identifying the transmit electrode to which the TX signal 224 was applied at the time the decrease in capacitance was measured on the one or more receive electrodes.

By determining the mutual capacitances associated with each intersection of electrodes in the matrix 225, the presence and locations of one or more conductive objects may be determined. The determination may be sequential, in parallel, or may occur more frequently at commonly used electrodes.

In alternative embodiments, other methods for detecting the presence of a finger or other conductive object may be used where the finger or conductive object causes an increase in measured capacitance at one or more electrodes, which may be arranged in a grid or other pattern. For example, a finger placed near an electrode of a capacitive sensor may introduce an additional capacitance to ground that increases the total capacitance between the electrode and ground. The location of the finger can be determined based on the locations of one or more electrodes at which a change in measured capacitance is detected.

The induced current signal 227 is integrated by demodulation circuit 216. The rectified current output by demodulation circuit 216 can then be filtered and converted to a digital code by ADC 217.

A series of such digital codes measured from adjacent sensor or intersections may be converted to touch coordinates indicating a position of an input on touch sensor array 121 by touch coordinate converter 218. The touch coordinates may then be used to detect gestures or perform other functions by the processing logic 102.

In one embodiment, the capacitance sensor 101 can be configured to detect multiple touches. One technique for the detection and location resolution of multiple touches uses a two-axis implementation: one axis to support rows and another axis to support columns. Additional axes, such as a diagonal axis, implemented on the surface using additional layers, can allow resolution of additional touches.

One embodiment of a touch-screen system may include an input for receiving an input signal that is generated based on a noise signal. For example, this input signal may be a reject signal or a start signal. The touch-screen system may further include a sequencer state machine coupled with the input. In one embodiment, the sequencer state machine may perform a series of conversions or subconversions for measuring capacitances from a capacitive sensor to which it is connected. The sequencer state machine may further control the timing of such conversions or subconversions based on the input signal. For example, the sequencer may start a subconversion (or a conversion including multiple subconversions) in response to detecting that a start signal is asserted, or may abort a subconversion that is pending or in progress in response to detecting that a reject signal is asserted. In one embodiment, where the capacitive sensor array is sensitive to the noise signal, this method may increase the SNR for the capacitance measurements.

Figure 3:
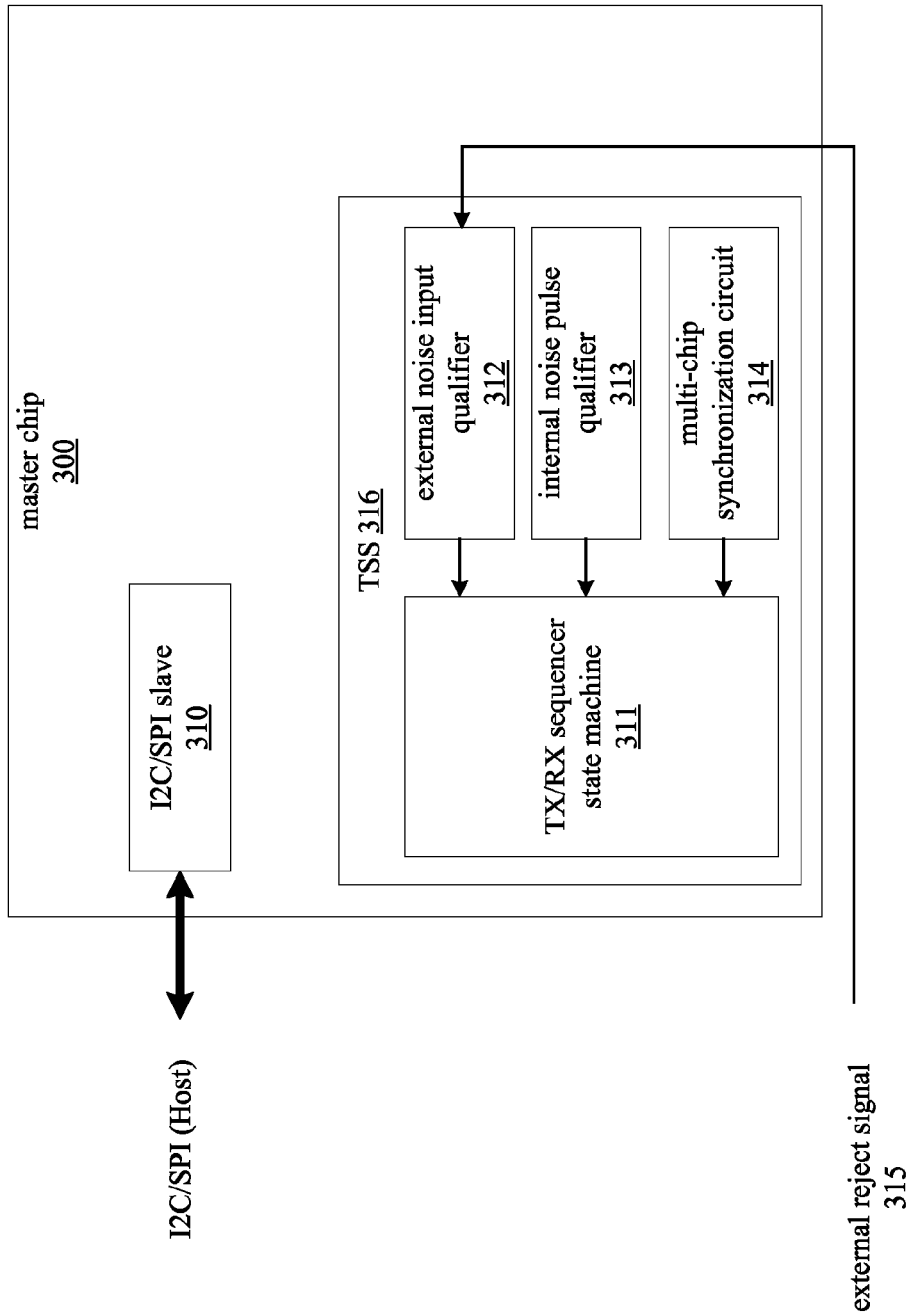
FIG. 3 illustrates an embodiment of master chip for controlling a touch-screen device.

FIG. 3 illustrates a single master integrated circuit chip 300 implementing an embodiment of such a touch-screen system. In one embodiment, the master chip 300 may be used to implement a processing device, such as processing device 110, as illustrated in FIG. 1.

Master chip 300 includes an (Inter-Integrated Circuit/System Packet Interface) I²C/SPI slave 310 for communicating with a host device. In one embodiment, the master chip 300 may also include a touch screen subsystem (TSS) 316. The TSS 316 includes an external noise input qualifier 312 that receives an external reject signal 315, an internal noise pulse qualifier 313, and a multi-chip synchronization circuit 314. In one embodiment, a TX/RX sequencer state machine 311 may receive signals from any one or more of the pulse qualifier circuits 312 and 313 or the synchronization circuit, and may further control the timing of conversions or subconversions performed on a capacitive sensor array based on signals received from the circuits 312, 313, or 314.

One embodiment of a master chip 300 may also include other logic such as universal digital blocks (UDBs) or a digital system interconnect (DSI). A UDB is a programmable logic block that may contain a combination of uncommitted logic and structured logic. A DSI may connect components of the master chip 300, such as fixed function blocks, I/O pins, interrupts, DMA signals, and other system core blocks to a UDB array routing matrix.

In one embodiment of a single-chip configuration, as illustrated in FIG. 3, the touch-screen system may rely on either its own noise detection circuitry, or may receive an input from an external noise detector. For example, the external noise input qualifier 312 receives an external reject signal 315, which may be generated by an external noise detector. In an embodiment, the external reject signal 315 may be a signal supplied by an LCD panel. In an alternative embodiment, the signal 315 may be a synchronization signal that allows the sequencer to synchronize subconversions or conversions to a periodic noise signal.

Figure 4:
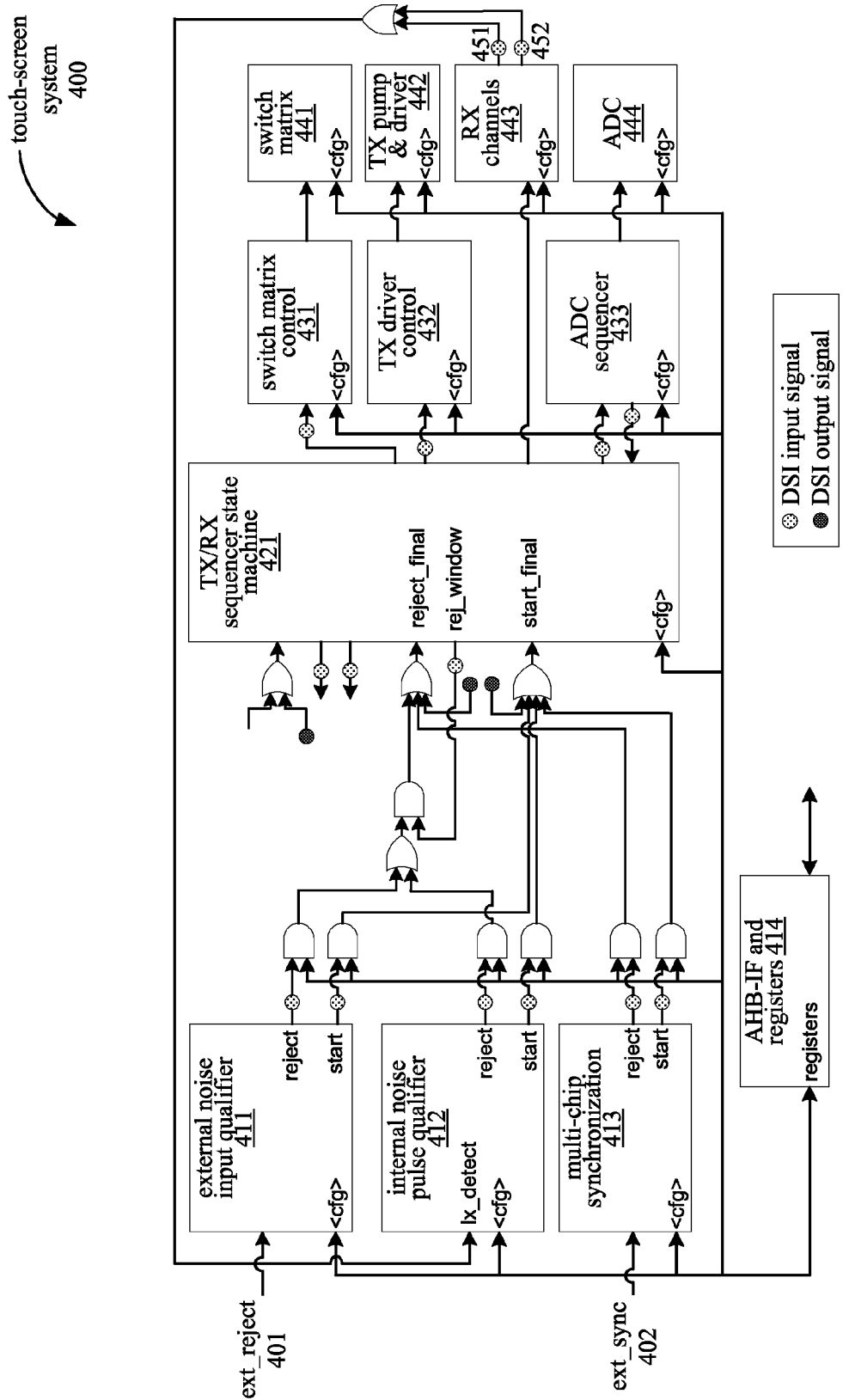
FIG. 4 illustrates components of a touch-screen system, according to an embodiment.

FIG. 4 illustrates an embodiment of touch-screen system 400, including a TX/RX sequencer state machine 421 and the connections between the sequencer and other components of touch-screen system 400. In one embodiment, the sequencer 421 may be similar to sequencer 311, as illustrated in FIG. 3. The external noise input qualifier 411, internal noise pulse qualifier 412, and multi-chip synchronization circuit 413 may operate in similar fashion as external noise input qualifier 312, internal noise pulse qualifier 313, and multi-chip synchronization circuit 314, respectively.

The sequencer 421 meters out the conversions, subconversions, TX pulses, and other signals associated with scanning of a capacitive sensor array. In one embodiment, the sequencer 421 is a configurable state machine with timed and conditional transitions.

In one embodiment, the sequencer 421 controls the switch matrix 441 via the switch matrix control 431 to connect and disconnect TX or RX sensing channels from the appropriate sensor elements over the course of a conversion. The sequencer 421 additionally controls the TX pump and driver 442 via TX driver control circuit 432 to transmit a TX signal on a sensor element on which a subconversion is being performed. The sequencer further controls the RX channels 443 to receive the RX signal for the subconversion, and controls the analog-to-digital converter (ADC) 444 via ADC sequencer 433 when converting the RX signal to a usable count value.

In one embodiment, the ext_reject signal 401 may be received from an external device through a pin of the device on which the components of system 400 are integrated. In one embodiment, the ext_reject signal 401 may be interpreted as either a reject signal used to abort subconversions, or as a start signal used to initiate subconversions or conversions.

In one embodiment, the synchronization signal ext_sync 402 may be received by a multi-chip synchronization circuit 413 from an external device through a pin of a device on which components of touch-screen system 400 are integrated. In one embodiment, the signal 402 may be used to synchronize state transitions of the TX/RX sequencer 421 as a slave device to an external master device, such as another integrated circuit chip including a similar touch-screen system. Thus, within each subconversion, each of the slave device's state machines may progress in a synchronized manner. For example, a multiple-chip touch-screen configuration may include multiple chips each connected to a separate capacitive sensor array. The chips may be synchronized to each other to coordinate scanning of their respective sensor arrays by transmitting and receiving at the same time. By this method, the touch-screen system may be used as a slave device to synchronize with a master device, thus enabling large panel operation through the use of multiple capacitive sensor arrays.

In one embodiment, the lx_detect signal of the internal noise pulse qualifier 412 may indicate that noise is detected by an internal noise detector. In one embodiment, the lx_detect is asserted in response to detecting a noise signal that is greater than (or less than) a predetermined threshold. In one embodiment, asserting the lx_detect signal initiates a rejection or synchronization of a subconversion. In one embodiment, the lx_detect signal may be generated as a result of a logical operation between an lx_detect_lo signal 452 and an lx_detect_hi signal 451. In one embodiment, signals 451 and 452 may be generated by comparators with different thresholds based on a signal from one or more of the receive (RX) channels 443. In one embodiment, the signals 451 and 452 may be available as inputs to the DSI for use in UDB logic.

In one embodiment, the reject signals output from the external noise input qualifier 411, internal noise pulse qualifier 412, and multi-chip synchronization circuit 413 may be used to cause the sequencer 421 to abort and reject an ongoing subconversion. In one embodiment, the reject signals of the external and internal noise pulse qualifiers 411 and 412 may be used in any combination, or they may be incorporated into the reject signal from the multi-chip synchronization circuit 413. In one embodiment, the sequencer may ignore the start and reject signals from the external and internal noise pulse qualifiers when using the multi-chip synchronization circuit.

In one embodiment, the internal noise pulse qualifier 412 may obtain noise information in the form of the lx_detect_hi 451 or lx_detect_lo 452 signals, which may be generated based on noise generated by a display panel, such as an LCD panel. The raw noise signal may be obtained from one of the RX channels 443. In one embodiment, the raw noise signal as processed by the pulse qualifier 412, which may be configured by registers 414 to perform operations such as debounce or change the polarity or phase delay of the noise signal. The outputs from the internal noise pulse qualifier 412 include a reject signal that may cause the sequencer 421 to abort and reset a subconversion that is in progress. The sequencer 421 may further discard any measurement data acquired by the aborted subconversion.

In one embodiment, the reject_final signal that is input to the sequencer 421 is the result of logical combination of the other reject signals (from modules 411-413) and the rej_window signal. The logical combination may also include an input from the DSI, so that the reject_final signal may be controlled by a programmable UDB. In one embodiment, the sequencer responds to the reject_final signal by controlling the timing of a conversion or subconversion. For example, in response to detecting that the reject_final signal is asserted, the sequencer may abort and reject a subconversion that is in progress during a time indicated by the assertion of the reject_final signal. In one embodiment, the sequencer does not begin a new subconversion until the reject_final signal is deasserted. In one embodiment, the subsequent subconversion attempts will be aborted until the reject_final signal is deasserted. For instance, if a reject occurs, the ongoing subconversion may be aborted and a new subconversion may start; however, the new subconversion may also be rejected some time later during the sensitivity window. Thus, in one embodiment, the rejection of a subconversion does not prevent a new subconversion from starting.

In one embodiment, the internal noise pulse qualifier 421 may also generate a start signal by processing the raw noise signal. The start signal may cause the sequencer 421 to initiate a subconversion, or may be used by the sequencer 421 to synchronize a series of subconversions to the noise signal.

In one embodiment, the circuit modules 411, 412, 413, 421, 431, 432, 433, 441, 442, 443, and 444 may have configuration parameters stored in registers 414. The use of each of the rejection or synchronization sources for rejecting or initiating subconversions or conversions may be configured through the registers 414.

In one embodiment, the external noise input qualifier 411 receives an external signal from a noise detector and causes the sequencer 421 to control timing of one or more conversions or subconversions based on the received external signal. In one embodiment, the external noise input qualifier 411 may process the external signal by performing polarity, phase delay, edge or level detection, debouncing, or other functions on the external signal. The external signal may be used, before or after processing, to cause the sequencer 421 to either reject and abort subconversions, or to initiate subconversions.

Figure 5:
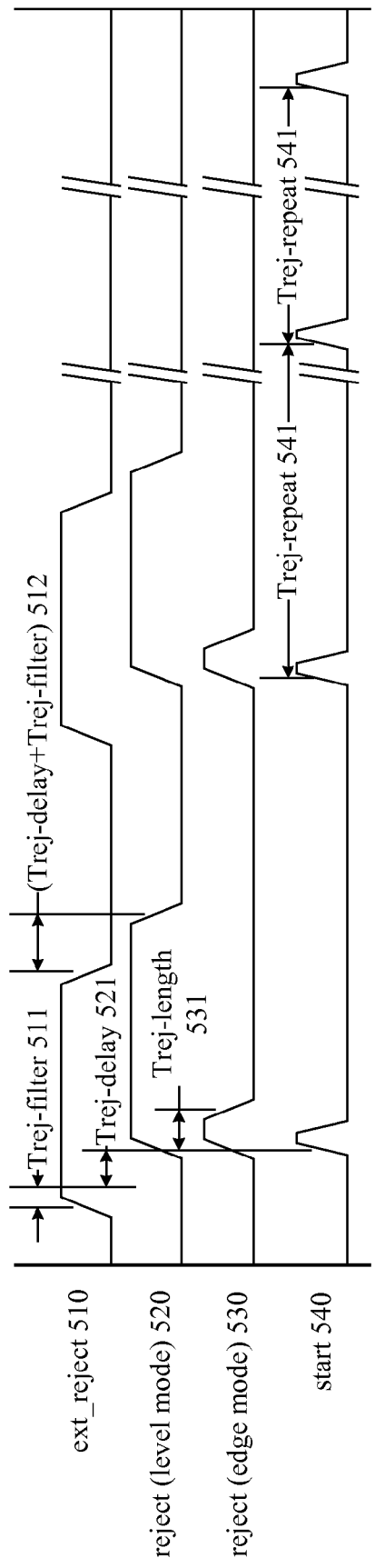
FIG. 5 illustrates timing diagram of signals in a touch-screen system, according to an embodiment.

FIG. 5 is a diagram illustrating the timing of signals output by the external noise input qualifier 411. The ext_reject signal 510 may correspond to the ext_reject signal 401, as illustrated in FIG. 4. In one embodiment, the ext_reject signal 510 has configurable polarity. As an example, FIG. 5 illustrates ext_reject signal 510 as having a positive polarity. The reject signals 520 and 530 may correspond to the reject output of the external noise input qualifier 411, and the start signal 540 may correspond to the start output of the external noise input qualifier 411.

The Trej-filter 511 duration is a threshold duration associated with filtering of the ext_reject signal 510. In one embodiment, if pulse of ext_reject 510 has a shorter duration than Trej-filter 511, the pulse is not reflected in the reject signal 520 or 530, or the start signal 540. Trej-delay is a delay between a time when the ext_reject signal 510 is asserted and the time when the reject and start signals 520-540 are asserted in response to the ext_reject signal 510. In one embodiment, the delay is configurable through the use of configuration registers 414. In one embodiment, both the start signal 540 and the reject signals 520 and 530 may be delayed by the Trej-delay 521 parameter to accommodate any delay between the asserting or deasserting of the ext_reject signal and the effect of the noise on the conversions or subconversions.

In one embodiment, the ext_reject signal 510 may be configured to cancel an ongoing subconversion in response to detecting that a noise signal has exceeded a threshold. The ext_reject signal 510 may alternatively be configured to start a conversion only after a timed synchronization pulse is received. In one embodiment, a combination of these strategies may also be used. For example, these signals may be made available to programmable UDBs through the DSI.

In one embodiment, a system operating in edge detect mode may generate a reject signal 530 by interpreting each positive or negative edge of the ext_reject signal as a noise event. A programmable duration Trej-length 531 may determine the length of time that the edge mode reject signal 530 is asserted in response to a positive or negative edge of ext_reject 510. The duration of Trej-length 531 may be stored, for example, in configuration registers 414.

In one embodiment, a system operating in a level detect mode may generate a reject signal 520 by interpreting a level of ext_reject exceeding a predetermined threshold as an ongoing noise event. The level mode reject signal 520 may be asserted for as long as the ext_reject signal 510 exceeds the predetermined threshold. Thus, the level mode reject signal 520 may be deasserted a period of time 512 after the deassertion of ext_reject that is approximately equal to Trej-delay+Trej filter.

In one embodiment, as illustrated in FIG. 4, the reject signal from the external noise input qualifier may be logically combined with one or more reject signals from other sources, such as an internal noise pulse qualifier or a multi-chip synchronization circuit to generate a reject_final signal. In one embodiment, the sequencer controls the timing of conversions or subconversions in response to the reject_final signal.

After a rejection of a subconversion, a new subconversion may be automatically started either immediately, or in response to a synchronization event, such as assertion of a start signal.

In one embodiment, the reject signals may cause the sequencer 421 to abort and reject an ongoing subconversion only when a sensitivity window signal (rej_window) is asserted, indicating that a noise sensitive operation is being performed. In one embodiment, a sequencer, such as sequencer 421, may assert a sensitivity window to indicate a time duration during which a subconversion or other sensitive operation is being performed. The sequencer may abort and reject the subconversion in response to detecting that a rejection signal (such as reject_final) is asserted during the time duration indicated by the sensitivity window.

In one embodiment, the sensitivity window is configurable to encompass either the entire subconversion, or only a portion of the entire subconversion, such as the integration periods within the subconversion. In one embodiment, the sensitivity window can be configured to encompass a particular time period with a predetermined margin and phase delay.

In one embodiment, the start of the sensitivity window (rej_window) may be configured by one or more programmable registers, which allows the start of the sensitivity window the flexibility to move into a subsequent state of the sequencer state machine. Thus, the sensitivity window can more readily be timed to encompass the time associated with a subconversion or other sensitive operation.

In one embodiment, the start signals output from modules 411-413 may be used to cause the sequencer 421 to start a subconversion or a series of subconversions. In one embodiment, the start signals may be pulse mode signals that initiate a subconversion upon a rising or falling edge, which may indicate a time for initiating the subconversion.

In one embodiment, the start signal may be used to synchronize individual TX pulses to an external signal source. For example, the start signal may allow a series of TX pulses to be synchronized to an LCD framer clock.

In one embodiment, the start signals from modules 411-413 may be logically combined, resulting in a start_final signal. The logical combination may also include inputs from the DSI, to allow the start_final signal to be controlled by a programmable UDB. In one embodiment, the sequencer responds to assertion of the start_final signal by initiating a subconversion, or by synchronizing a series of subconversions with the start_final signal.

Figure 6:
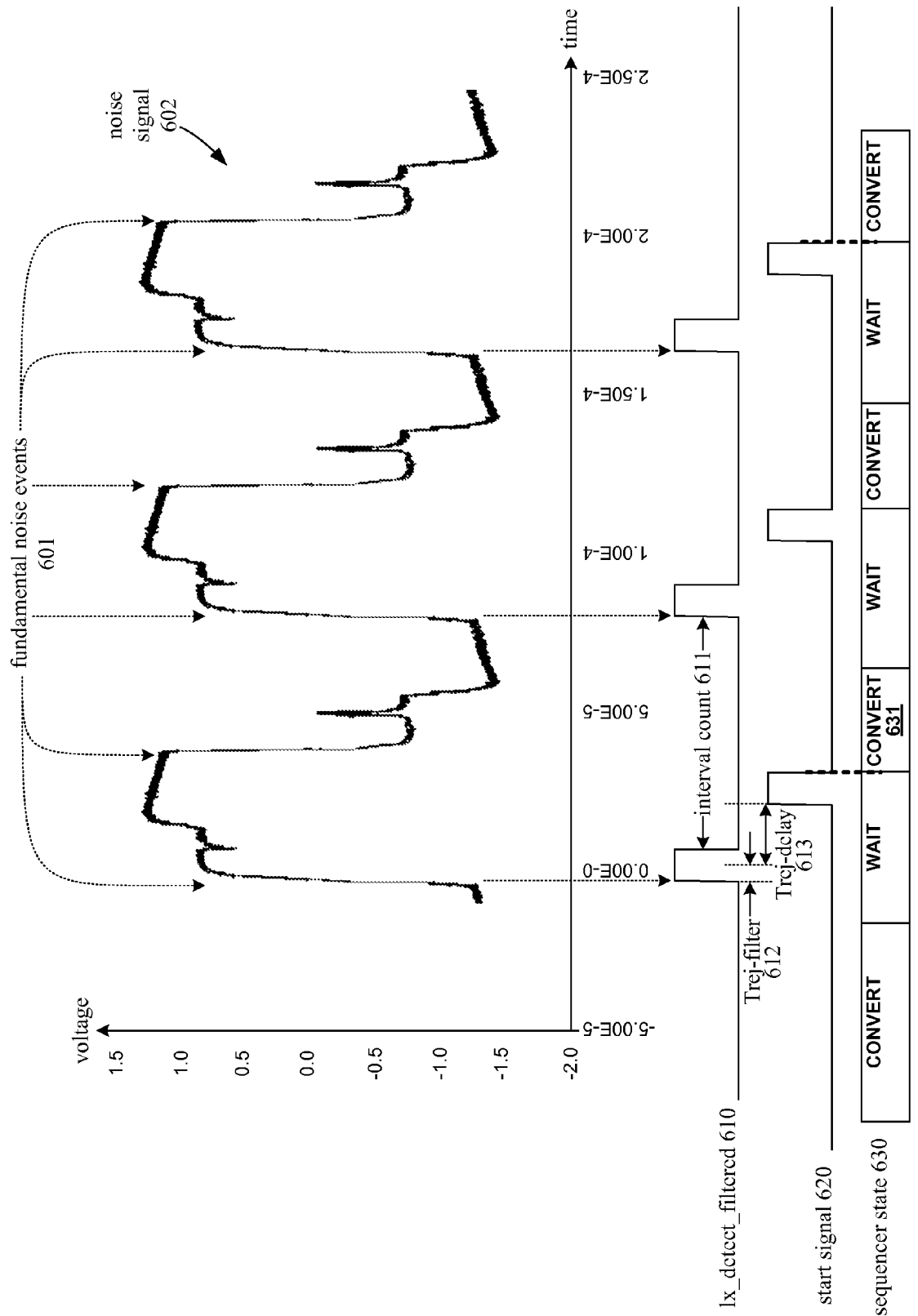
FIG. 6 illustrates a low frequency noise signal and timing diagram of signals in a touch-screen system, according to an embodiment.

FIG. 6 illustrates a low frequency periodic noise waveform along with timing of a start signal, according to an embodiment. In one embodiment, the lx_detect_filtered signal 610 is generated by a noise detection circuit based on the noise signal 602. For example, the noise signal 602 may be received at a listen (LX) channel coupled with a capacitive sensor element. The system may generate the lx_detect_filtered signal 610 by asserting the signal 610 at rising edges of the noise signal 602 that rise above a detection threshold. In one embodiment, the lx_detect_signal may be asserted in response to one or more fundamental noise events 601 of the noise signal 602.

Start signal 620 may be subsequently generated based on the lx_detect_filtered signal 610. For example, each pulse of start signal 620 may be generated to follow a pulse of lx_detect_filtered 610 by a configurable delay of Trej-delay 613. In one embodiment, the lx_detect_filtered signal 610 causes a pulse to be generated on the start signal 620 only after the lx_detect_filtered signal 610 is asserted for a minimum duration of Trej-filter 612. In one embodiment, Trej-filter 612 thus operates as a filtering delay that may also be configurable using registers or other memory.

In one embodiment, pulses of the start signal 620 may cause a sequencer state machine, such as sequencer 421, to change its state 630 to one or more conversion states, during which a subconversion may be performed. For example, the first pulse of start signal 620 causes the sequencer state 630 to advance to the convert state 631, during which a subconversion may be performed. In one embodiment, pulses of the start signal 620 are timed so that the subconversion may be completed in the quiet time between the large low frequency noise pulses, as illustrated in FIG. 6.

Figure 7:
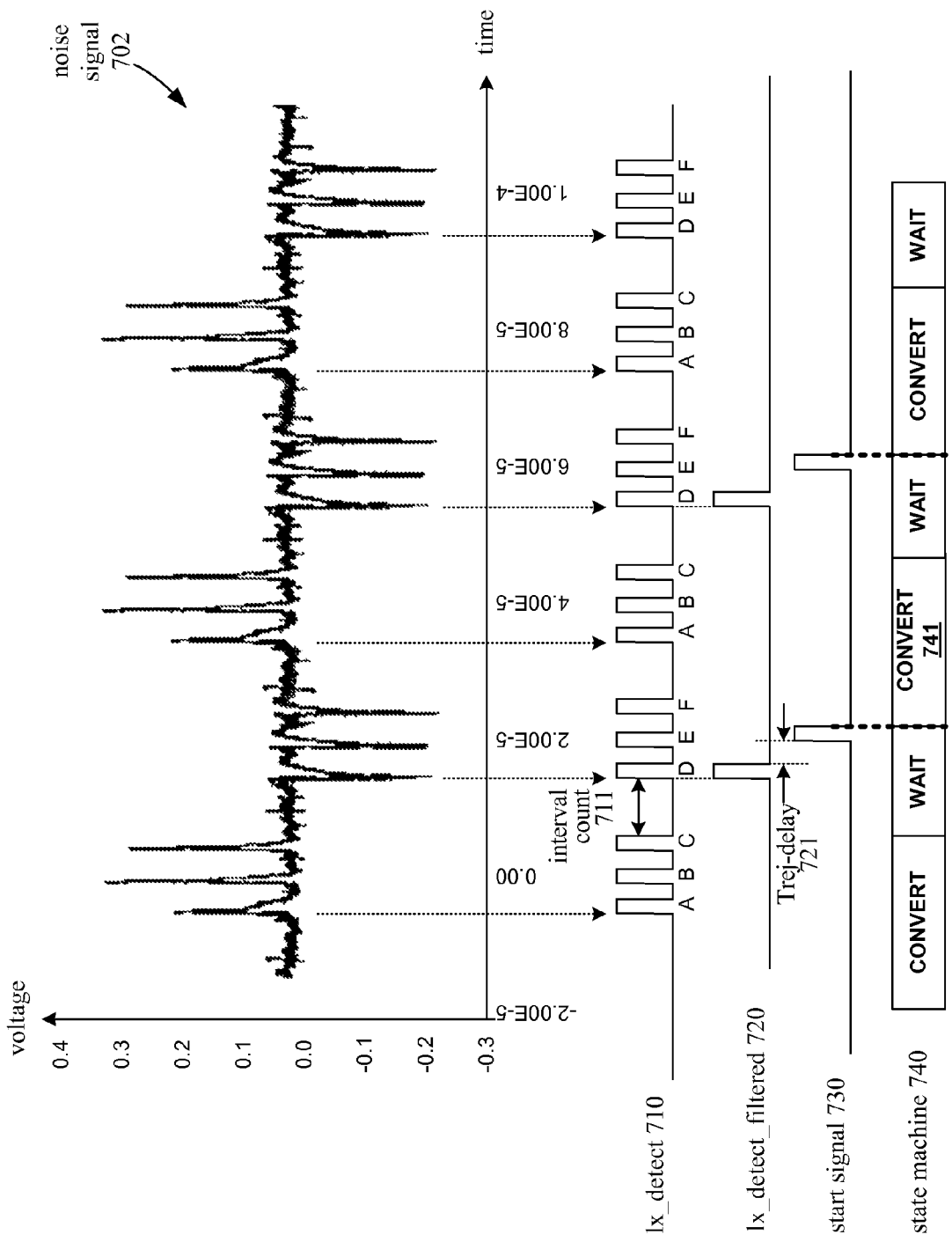
FIG. 7 illustrates a high frequency noise signal and timing diagram of signals in a touch-screen system, according to an embodiment.

FIG. 7 illustrates a high frequency periodic noise waveform along with timing of a start signal, according to an embodiment. In one embodiment, the lx_detect signal 710 is generated by a noise detection circuit based on the noise signal 702. For example, the lx_detect signal may include a pulse generated for each edge of the noise signal that exceeds a detection threshold. As illustrated in FIG. 7, each of the pulses A, B, and C each correspond to a rising edge of the noise signal 702, and pulses D, E, and F each correspond to a falling edge of the noise signal 702.

In one embodiment, an interval discriminator circuit coupled with the sequencer may be used to identify a predetermined feature of the noise signal, such as a specific recurring interval in the periodic signal. The recurring interval may then be used to time a series of subconversions so that each subconversion is performed during similar noise conditions. For example, a subconversion performed during the convert state 741 may be performed under similar noise conditions as subconversions performed during subsequent convert states. The noise may then appear as a constant offset which can be more easily compensated.

For example, the interval between pulses C and D may be identified by an interval discriminator circuit based on the interval count 711 between the pulses C and D. In one embodiment, the interval discriminator circuit may measure the interval C-D from the end of a previous noise event C to the beginning of a current noise event D. When the length of the interval falls within a predetermined range, a start signal pulse is generated. In one embodiment, when the interval is identified, a pulse may be generated in the lx_detect_filtered signal 720. In response to this pulse, another pulse may be generated in the start signal 730 after a configurable delay of Trej-delay 721.

In one embodiment, during either of the methods as illustrated in FIGS. 6 and 7, a reject signal may also be used to abort and reject an ongoing subconversion in response to an unexpected noise event that occurs during the synchronized subconversions. In one embodiment, a listen channel may also be used for noise subtraction while either of these methods is in use.

In one embodiment, a pulse of start signal 540 may be generated in response to an assertion of the ext_reject signal 510. In one embodiment, the start pulse may be repeated to trigger subsequent subconversions. The start pulses may be spaced apart in time by a configurable duration Trej-repeat 541. In one embodiment, the duration of Trej_repeat 541 is constant; alternatively, the duration of Trej_repeat 541 may vary over time. In one embodiment, either or both of the external noise input qualifier 411 and the internal noise pulse qualifier 412 may implement a repeat start function, such that the series of start pulses may be generated even when the ext_reject signal does not assert or the noise signal decreases below a detection threshold. Thus, conversions or subconversions that are started based on the pulse qualifier output do not stop or hang if, for some reason, the noise or synchronization signal disappears.

In one embodiment, the repeated start functionality allows the generation of repeated start signals at a programmable interval. This could be used as a backup in the case where an external or internal signal is being used to generate start signals to the sequencer state machine. Repeated start generation would reduce the likelihood that the sequencer state machine would hang if for some reason the external or internal noise signals stopped asserting.

In one embodiment, an input or pulse qualifier implementing a repeat start function may also implement a programmable noise timeout nse_timeout. If no ext_reject pulse is received for a duration defined by nse_timeout, an interrupt flag may be asserted to indicate that the ext_reject signal has stopped asserting. This may indicate a problem with the noise detection scheme or a change in the noise profile, which may then be addressed by the system.

In one embodiment, a start signal pulse may be generated in response to a period of low noise detected by a noise detection circuit. The start pulse may then be used by a sequencer to initiate a subconversion during the detected period of low noise.

In one embodiment, the internal noise pulse qualifier 412 implements reject and start signals having similar functionality as the level mode and edge mode reject signals 520 and 530 and the start signal 540, as illustrated in FIG. 5. The two qualifier circuits 411 and 412 differ in their input signals; the external noise input qualifier 411 receives and processes the ext_reject signal, while the internal noise pulse qualifier 412 processes the lx_detect signal from an RX channel used as an internal listen channel.

In one embodiment, the touch-screen system 400 may implement a noise characterisation mode, which allows profiling of a noise pattern of a noise source, such as an LCD panel. In one embodiment, such a noise characterization process may determine the high and low times of the noise pattern. This characterization data may be stored in RAM or other memory, such that one or more configurations for the pulse qualifier may be selected for use based upon the characterization data making up the noise profile. These configurations that could be selected based on the characterization data may include parameters such as the Trej_filter and interval discrimination limits.

Embodiments of the present invention, described herein, include various operations. These operations may be performed by hardware components, software, firmware, or a combination thereof. As used herein, the term "coupled to" may mean coupled directly or indirectly through one or more intervening components. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a computer-readable medium. These instructions may be used to program a general-purpose or special-purpose processor to perform the described operations. A computer-readable medium includes any mechanism for storing or transmitting information in a form (e.g., software, processing application) readable by a machine (e.g., a computer). The computer-readable storage medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory, or another type of medium suitable for storing electronic instructions.

Additionally, some embodiments may be practiced in distributed computing environments where the computer-readable medium is stored on and/or executed by more than one computer system. In addition, the information transferred between computer systems may either be pulled or pushed across the transmission medium connecting the computer systems.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A method, comprising:
at a device with a touch sensitive display comprising a plurality of capacitive sensors:
generating a sensitivity window that defines a time duration for performing at least one noise-sensitive operation;
receiving a reject signal while performing a series of measurements to measure capacitances of a capacitive sensor of the plurality of capacitive sensors;
when the reject signal is received during the sensitivity window and the reject signal exceeds a predetermined threshold, controlling timing for at least one capacitance measurement of the series of measurements based on the reject signal and the sensitivity window; and
when the reject signal is received outside of the sensitivity window or the reject signal does not exceed the predetermined threshold, ignoring the reject signal.

2. The method of claim 1, wherein each measurement of the series of measurements is a subconversion.

3. The method of claim 1, wherein controlling the timing comprises aborting the at least one capacitance measurement at a time indicated by the reject signal.

4. The method of claim 3, wherein the at least one noise-sensitive operation comprises the at least one capacitance measurement; and
wherein controlling the timing comprises aborting the at least one capacitance measurement in response to detecting that the reject signal is asserted during the time duration indicated by the sensitivity window.

5. The method of claim 1, further comprising generating a start signal in accordance with a determination that the reject signal no longer exceeds the predetermined threshold.

6. The method of claim 5, wherein the start signal comprises a periodic pulse train, and wherein each pulse of the periodic pulse train indicates a time for initiating a measurement of a capacitive sensor of the plurality of capacitive sensors.

7. An apparatus, comprising:
a first input configured to generate a sensitivity window that defines a time duration for performing at least one noise-sensitive operation;
a capacitive sensor sensitive to a noise signal; and
a sequencer coupled with the first input and the capacitive sensor, wherein the sequencer is configured to receive a reject signal while performing a series of measurements to measure capacitances of a capacitive sensor of the plurality of capacitive sensors, and configured to:
when the reject signal is received during the sensitivity window and the reject signal exceeds a predetermined threshold, control timing for at least one capacitance measurement of the series of measurements based on the reject signal and the sensitivity window; and
when the reject signal is received outside of the sensitivity window or the reject signal does not exceed the predetermined threshold, ignore the reject signal.

8. The apparatus of claim 7, wherein each measurement of the series of measurements is a subconversion.

9. The apparatus of claim 7, wherein the sequencer is configured to control the timing of the at least one measurement by aborting the at least one capacitance measurement at a time indicated by the reject signal.

10. The apparatus of claim 9, wherein the sequencer is further configured to:

abort the at least one capacitance measurement in response to detecting that the reject signal is asserted during the time duration indicated by the sensitivity window, wherein the at least one noise-sensitive operation comprises the at least one capacitance measurement.

11. The apparatus of claim 7, further comprising an interval discriminator circuit coupled with the sequencer, wherein the interval discriminator circuit is configured to generate a start signal in accordance with a determination that the reject signal no longer exceeds the predetermined threshold.

12. The apparatus of claim 11, wherein the start signal comprises a periodic pulse train, and wherein each pulse of the periodic pulse train indicates a time for initiating a measurement of a capacitive sensor of the plurality of capacitive sensors.

13. An apparatus, comprising:

a capacitive sense array comprising a plurality of capacitive sensors, wherein the capacitive sense array is configured to detect a touch object; and a processing device coupled to the capacitive sense array, the processing device configured to:

generate a sensitivity window that defines a time duration for performing at least one noise-sensitive operation;

receive a reject signal while performing a series of measurements to measure capacitances of a capacitive sensor of the plurality of capacitive sensors;

when the reject signal is received during the sensitivity window and the reject signal exceeds a predetermined threshold, control timing for at least one capacitance measurement of the series of measurements based on the reject signal and the sensitivity window; and when the reject signal is received outside of the sensitivity window or the reject signal does not exceed the predetermined threshold, ignore the reject signal.

14. The apparatus of claim 13, wherein each measurement of the series of measurements is a subconversion.

15. The apparatus of claim 13, wherein controlling the timing comprises aborting the at least one capacitance measurement at a time indicated by the reject signal.

16. The apparatus of claim 15, wherein the at least one noise-sensitive operation comprises the at least one capacitance measurement; and wherein controlling the timing comprises aborting the at least one measurement in response to detecting that the reject signal is asserted during the time duration indicated by the sensitivity window.

* * * * *